United States Patent [19]

Liles et al.

[11] Patent Number: 5,646,450
[45] Date of Patent: Jul. 8, 1997

[54] SEMICONDUCTOR STRUCTURES AND METHOD OF MANUFACTURING

[75] Inventors: Barry J. Liles, Westboro; Mark S. Durschlag, Waban; James G. Oakes, Sudbury, all of Mass.

[73] Assignee: Raytheon Company, Lexington, Mass.

[21] Appl. No.: 594,511

[22] Filed: Jan. 31, 1996

Related U.S. Application Data

[63] Continuation of Ser. No. 251,879, Jun. 1, 1994, abandoned.

[51] Int. Cl.$^6$ .............. H01L 23/48; H01L 23/52; H01L 29/40
[52] U.S. Cl. .............. 257/776; 257/762; 257/763; 257/768
[58] Field of Search ................ 257/666, 664, 257/691, 692, 764, 776, 276, 751, 753, 767, 763, 640, 644, 768

[56] References Cited

U.S. PATENT DOCUMENTS

| | | | |
|---|---|---|---|
| 4,404,735 | 9/1983 | Sakurai | 257/646 |
| 4,456,888 | 6/1984 | Ayasli | 330/277 |
| 4,959,705 | 9/1990 | Lemnios et al. | 257/276 |
| 5,148,260 | 9/1992 | Inoue et al. | 257/762 |
| 5,306,936 | 4/1994 | Goto | 257/640 |

FOREIGN PATENT DOCUMENTS 60-07175  1/1985  Japan.

*Primary Examiner*—Mahshid D. Saadat
*Assistant Examiner*—Jhihan B. Clark
*Attorney, Agent, or Firm*—Donald F. Mofford

[57] ABSTRACT

A semiconductor structure is described having a first electrode and a second electrode disposed on a surface of the structure and a bridging conductor connected between the first electrode and the second electrode. The bridging conductor includes a plurality of layers of different metals wherein the plurality of layers of different metals includes a layer of refractory metal adjacent a layer of electrically conductive metal. In a preferred embodiment, the refractory metal is titanium and the electrically conductive metal is gold. With such an arrangement, a semiconductor structure is provided which is effective in preventing restructuring due to mechanical stresses induced in the metal by dissimilar thermal expansion coefficients when electrical pulsing cycles the temperature of the semiconductor structure.

6 Claims, 3 Drawing Sheets

5,646,450

1

SEMICONDUCTOR STRUCTURES AND METHOD OF MANUFACTURING

This application is a continuation of application Ser. No. 08/251,879 filed Jun. 1, 1994, now abandoned.

This invention was made with Government support under Contract No. DASG60-92-C-0184 awarded by the Department of the Army. The Government has certain rights in this invention.

BACKGROUND OF THE INVENTION

This invention relates generally to semiconductor structures and manufacturing methods and more particularly to electrical components adapted for monolithic microwave integrated circuit (MMIC) fabrication.

As is known in the art, it is frequently desirable to fabricate, and electrically interconnect, both passive and active microwave components on a common substrate. Such arrangement is commonly referred to as a monolithic microwave integrated circuit. Typically the components are electrically interconnected with microstrip transmission lines. The microstrip transmission lines include strip conductor circuitry disposed on one surface of the structure and separated from a ground plane conductor by a substrate. The active devices are typically, for example, heterojunction bipolar transistors (HBTs), field effect transistors (FETs), bipolar devices or PIN diodes. A common substrate material used is gallium arsenide. Such substrate material is suitable for the passive microstrip transmission line circuitry, the support of passive devices, such as capacitors, and also for formation of single crystal epitaxial layers used to form the active semiconductor region for the HBTs and the FETs.

As is known in the art, many active devices are formed with interdigitated electrodes. For example, FETs (or bipolar transistors) adapted to operate at high frequencies are sometimes formed with finger shaped gate electrodes (or base electrodes) and finger shaped drain electrodes (or collector electrodes). The finger shaped electrodes are disposed in an interdigitated relationship over a surface of a semiconductor body. Source electrodes (or emitter electrodes) are disposed over the surface and are positioned between a pair of the gate electrodes (or base electrodes). The gate electrodes (or base electrodes) are electrically connected, at proximal ends thereof, to a bus disposed on the surface of the semiconductor. Likewise, the drain electrodes (or collector electrodes) are electrically connected, at proximal ends thereof, to a bus disposed on the surface of the semiconductor body. The source electrodes are connected using bridging conductors, sometimes referred to as air-bridges, which have ends connected to a pair of the source electrodes and which span over gate and drain electrodes. The latter technique is described in U.S. Pat. No. 4,456,888, issued Jun. 26, 1984 and entitled "Radio Frequency Network Having Plural Electrically Interconnected Field Effect Transistor Cells".

SUMMARY OF THE INVENTION

With the foregoing background in mind, it is an object of this invention to provide a technique for fabricating improved bridge conductors and other metalization conductors.

Another object of this invention is to provide a bridge conductor in a field effect transistor used as an amplifier in a MMIC that can withstand pulsed signals.

Still another object of this invention is to provide a technique of fabricating a bridge conductor that eliminates

2 restructuring during use which is compatible with current manufacturing processes.

The foregoing and other objects of this invention are met generally by a semiconductor structure having a first electrode and a second electrode disposed on a surface of the structure and a bridging conductor connected between the first electrode and the second electrode. The bridging conductor includes a plurality of layers of different metals wherein the plurality of layers of different metals includes a layer of refractory metal adjacent a layer of electrically conductive metal. In a preferred embodiment, the refractory metal is titanium and the electrically conductive metal is gold. With such an arrangement, a semiconductor structure is provided which is effective in preventing restructuring due to mechanical stresses induced in the metal by dissimilar thermal expansion coefficients when electrical pulsing cycles the temperature of the semiconductor structure.

In accordance with another aspect of the present invention, a layer of silicon nitride glassivation is provided over the metal stack to further constrain the free surface of the metal stack.

In accordance with an additional feature of the invention a method of fabricating an improved semiconductor structure is provided including the steps of forming a first electrode and a second electrode on a surface of the semiconductor structure and depositing a temporary material between the first electrode and the second electrode. The method further includes depositing a refractory material over the temporary material and the first and the second electrode and depositing an electrically conductive material over the refractory material. Completing the method includes depositing a refractory material over the electrically conductive material and eliminating the temporary material between the first electrode and the second electrode. Such a technique provides a semiconductor structure which is effective to endure long pulse signals amplified therein.

BRIEF DESCRIPTION OF THE DRAWINGS

For a more complete understanding of the concepts of the invention reference is now made to the following description taken in connection with the accompanying drawings, in which.

DESCRIPTION OF THE PREFERRED EMBODIMENTS

Figure 1:
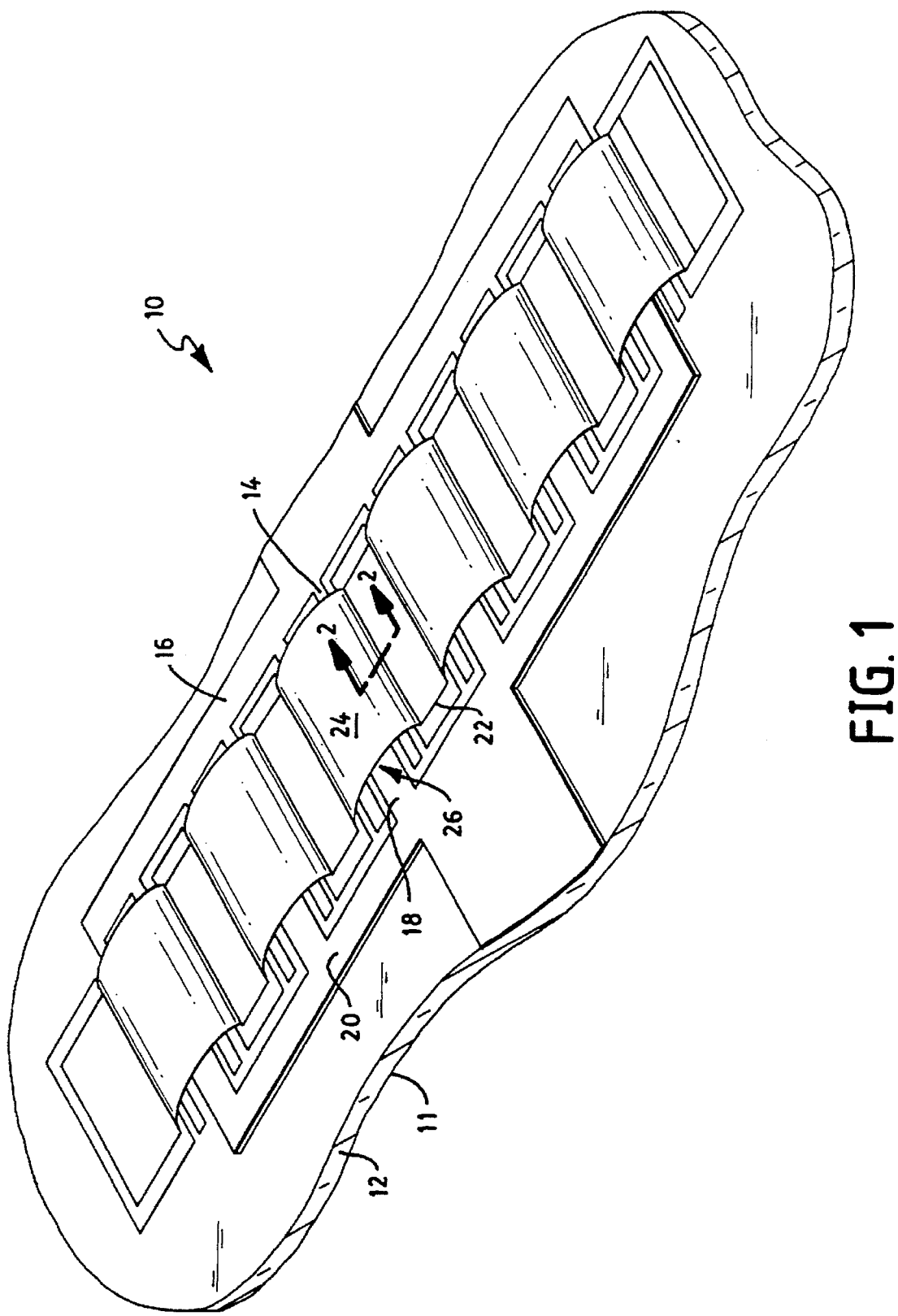
FIG. 1 is an isometric view, somewhat out of proportion and simplified, of a semiconductor structure according to the invention.

Referring now to FIG. 1, a semiconductor structure 10 is shown, here a Metal-Semiconductor Field Effect Transistor (MESFET) which is part of a monolithic microwave integrated circuit (MMIC). The structure 10 includes a substrate 12, here of GaAs and a ground plane conductor 11 formed on the bottom surface of the substrate 12, as shown. The structure 10 includes a plurality of gate electrodes as typified by gate electrode 14 which are connected to a common bus 16 as shown. The structure 10 still further includes a plurality of source electrodes as typified by source electrode 22. The plurality of source electrodes as typified by source electrode 22 are connected by bridging conductor 24 which is separated from the gate electrodes as typified by gate electrode 14 and the drain electrodes as typified by drain electrode 18 with an air gap 26. Known bridging conductors are fabricated from a conductive material such as gold. When operating the structure 10 having known bridging conductors in a pulsed mode using long pulses as compared to the thermal time constant of the structure 10, the bridging conductors show eruptions or dendrites and voids after a typical burn-in time (i.e. 160 hours). This restructuring of the bridging conductors may ultimately result in failure of the structure 10 or degradation of the performance of the structure 10.

Figure 4A:
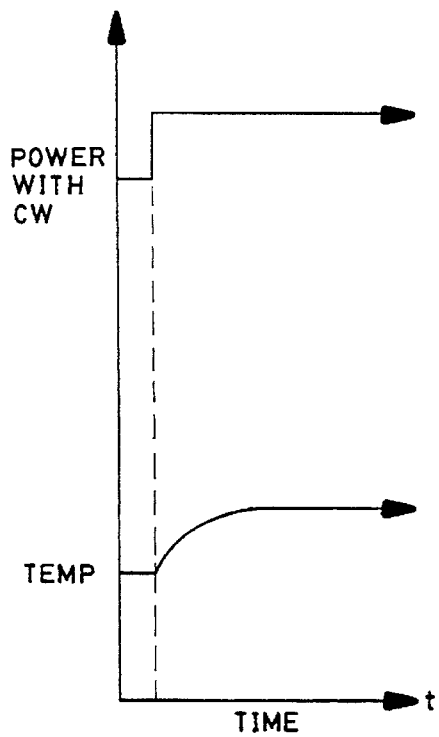
FIGS. 4A, 4B and 4C are diagrams showing the relationship between the type of signal and temperature of the structure for a CW signal, a short pulse signal and a long pulse signal, respectively.
Figure 4B:
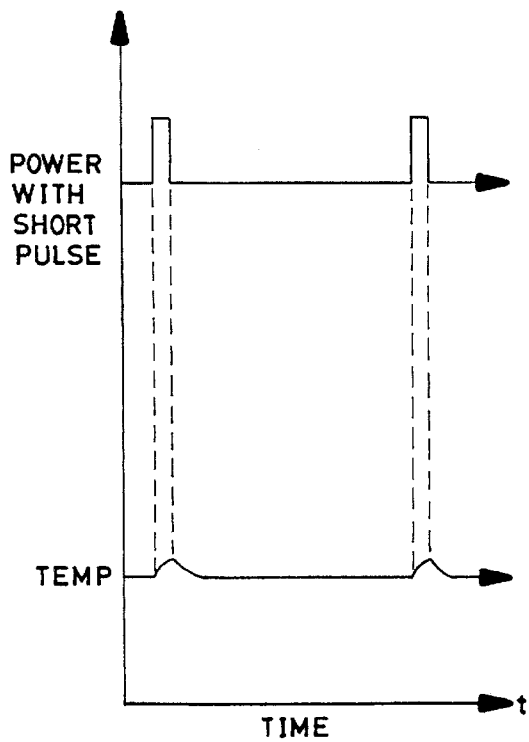
Figure 4C:
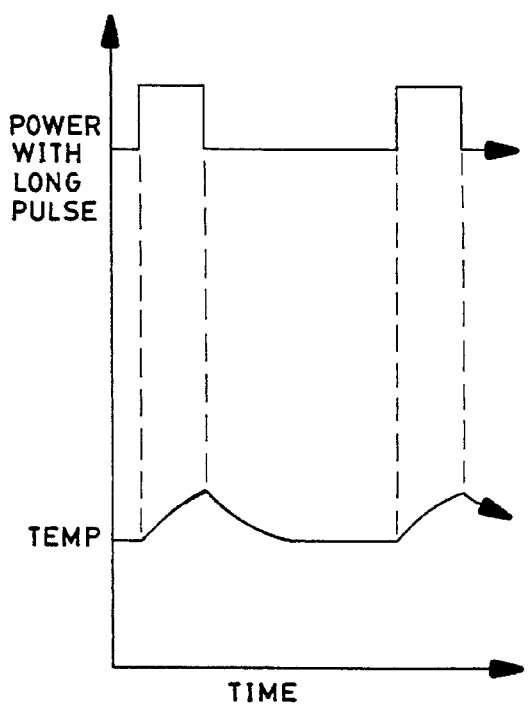

Upon investigation, it appears the constant heating and cooling of the bridging conductors is causing the restructuring. Referring now to FIGS. 4A, 4B and 4C, in a continuous wave (CW) application, power is constantly applied to the structure 10 such that the structure 10 increases in temperature corresponding with the power level provided by the structure 10, but then remains at the increased temperature until the power is shut off. In a short pulsed application, power is applied to the structure 10 such that the structure 10 increases in temperature until the pulse is turned off and then the structure 10 decreases in temperature. Where the pulse is of a short duration, the temperature of the structure 10 increases a relatively small amount preventing restructuring of the bridging conductors. In a long pulsed application, power is applied to the structure 10 such that the structure 10 increases in temperature until the pulse is turned off and then the structure 10 decreases in temperature. Where the pulse is of a long duration (for example, on for 10 milliseconds and off for 30 milliseconds), the temperature of the structure 10 increases a larger amount causing physical stress and restructuring of the bridging conductors.

It should be appreciated that the thermal expansion coefficient (coefficient of linear expansion) of gold is $14.2\times10^{-6}/C.°$, the thermal expansion coefficient of gallium arsenide (GaAs) is $5.9\times10^{-6}/C.°$, the thermal expansion coefficient of silicon nitride ($Si_3N_4$) is $2.5\times10^{-6}/C.°$ and the thermal expansion coefficient of titanium is $8.5\times10^{-6}/C.°$. With different thermal expansion coefficients, the dissimilar materials expand and contract at different rates putting stress on the bridging conductors. As shown in FIG. 4A, a CW signal causes the structure 10 to undergo a change in temperature when power is applied to the structure 10. The change in temperature causes the structure to expand and the dissimilar materials readjust to compensate for expansion stressing the bridging conductors. In a CW signal application, once the structure 10 readjusts to the new temperature, the stress does not change. As shown in FIG. 4B, a short pulse signal causes the structure 10 to undergo a change in temperature when power is applied to the structure 10 and then the structure 10 returns to the original temperature after the pulse stops. The change in temperature causes the structure to expand and the dissimilar materials readjust to compensate for expansion stressing the bridging conductors and as the structure 10 returns to an original temperature the dissimilar materials adjust back to their original positions. Where the pulse is short as compared to the thermal time constant of the structure, the change of temperature is relatively small and the dissimilar materials move very little resulting is little or no restructuring of the bridging conductor. As shown in FIG. 4C, a long pulse signal also causes the structure 10 to undergo a change in temperature when power is applied to the structure 10 and then the structure 10 returns to the original temperature after the pulse stops. The change in temperature causes the structure to expand and the dissimilar materials move to compensate for expansion stressing the bridging conductors and as the structure 10 returns to an original temperature the dissimilar materials adjust back to their original positions. But where the pulse is long as compared to the thermal time constant of the structure, the change of temperature is larger and the dissimilar materials move a greater distance resulting in restructuring of the bridging conductor.

Figure 3:
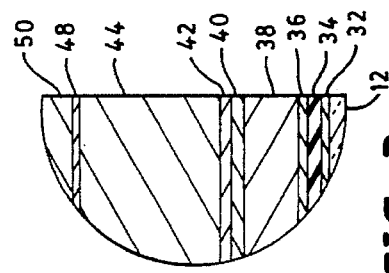
FIG. 3 is an enlarged cross-sectional view of the semiconductor structure of FIG. 2 taken along lines 3—3.
Figure 2:
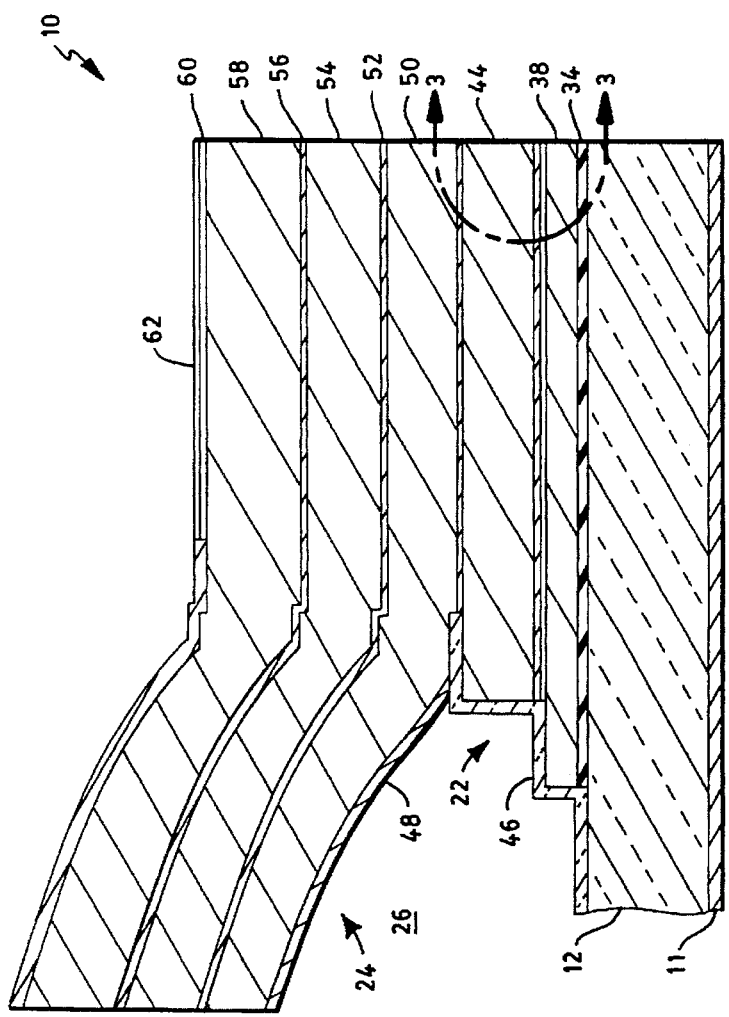
FIG. 2 is a cross-sectional view of the semiconductor structure of FIG. 1 taken along lines 2—2 showing multilayer bridging conductors according to the invention.

Referring now to FIGS. 2 and 3, a portion of the structure 10 is shown to include the substrate 12 and the ground plane conductor 11 formed on the bottom surface of the substrate 12. Typically, the substrate 12 has a thickness of 100 microns. To provide the structure 10, a plurality of ion implanted layers 30 are formed on the top surface of the substrate 12 in accordance with techniques well known in the art. It should be appreciated that sequentially vapor-phase epitaxial deposited techniques could also be used as well as other layer forming techniques. First a layer 32 of nickel having a thickness of 50 angstroms is deposited followed by a layer 34 of a gold-germanium alloy having a thickness of 900 angstroms. Next a layer 36 of nickel having a thickness of 300 angstroms is deposited followed by a layer 38 of gold having a thickness of 3000 angstroms. Next a layer 40 of titanium having a thickness of 1000 angstroms is deposited followed by a layer 42 of platinum having a thickness of 1000 angstroms. Finally, completing the source electrode 22, a layer 44 of gold having a thickness of 8000 angstroms is deposited. It should be appreciated that the gate electrodes and the drain electrodes are fabricated in a like manner during the just described process using known techniques.

Having formed the electrodes, a layer 46 of silicon nitride ($Si_3N_4$) having a thickness of 2000 angstroms is deposited to provide passivation and a capacitance dielectric and to raise the transmission line from the GaAs. Next, a mask is laid over the structure 10 and portions of the layer 46 are etched away as required such that the surfaces beneath the layer 46 are exposed.

It should be appreciated that a layer of photoresist or like material is deposited under the bridging conductor 24 before a layer 48 is deposited to form the shape of the bridging conductor 24 and after the bridging conductor 24 is formed the layer of photoresist is etched away to provide the air gap 26.

Unlike known bridging conductors, which are fabricated from a conductive material such as gold, the bridging conductors including the bridging conductor 24 are fabricated from a stack of layers of metals to reduce the restructuring of the bridging conductors. In embodiment shown, to form the bridging conductor 24, typical of the plurality of bridging conductors, a layer 48 of titanium having a thickness of 500 angstroms is deposited followed by a layer 50 of gold having a thickness of 9000 angstroms.

Next a layer 52 of titanium having a thickness of 500 angstroms is deposited followed by a layer 54 of gold having a thickness of 9000 angstroms. Next a layer 56 of titanium having a thickness of 500 angstroms is deposited followed by a layer 58 of gold having a thickness of 12000 angstroms. Next a layer 60 of titanium having a thickness of 500 angstroms is deposited. A glassivation layer 62 of silicon nitride ($Si_3N_4$) having a thickness of 1000 angstroms is deposited over the layer 60 of titanium and a mask (not shown) is laid over the structure 10 and portions of the layer 60 and the layer 62 are etched away such that the surfaces beneath the layer 60 are exposed to provide for wire bonding to the gold as required.

By alternating layers of titanium and gold, a bridging conductor is provided having increase strength. It should be appreciated that as gold is deposited on the structure 10, the first gold atoms will attach to the structure 10 in a random orientation. As additional gold atoms attach to the former gold atoms, the additional gold atoms will align and attach themselves to the former gold atoms. Eventually, gold deposits will encounter other gold deposits and where the different gold deposits meet, there is a discontinuity in the crystalline structure of the gold layer known as a grain boundary. In a bridging conductor fabricated from a single layer of gold, as excessive stress is applied to the bridging conductor, the bridging conductor typically fail at the discontinuities. In the bridging conductor 24, the layers 48, 52, 56 of titanium displace the discontinuities in the crystalline structure of the gold preventing a discontinuity from existing from the bottom to the top surface of a bridging conductor or a major portion thereof. Furthermore, titanium is a harder metal than gold such that as the gold is stressed and is pushed in an outward manner, the titanium constrains the gold within the space provided instead of allowing the gold to protrude and restructure.

It should be appreciated that the number of alternating layers of titanium and gold may be changed as well as the thickness of each of the layers. In some applications, partial restructuring of the top layer may be permitted eliminating the need for the glassification layer 62. Without the glassification layer 62, partial restructuring of the layer 58 and the layer 60 will occur.

The bridging conductor 24 having a plurality of alternating layers of a good conducting metal (i.e gold) and then a refractory metal (i.e. titanium) reduces the effect of dislocation glide which causes the eruptions or dendrites and voids. With more alternating layers the bridging conductor is stronger, but the number of steps required during the evaporation process is increased. In the present application, it was found that the four layers of titanium and the three layers of gold with a glassification layer on top was suitable.

Having described preferred embodiments of the invention it will now be apparent to one of skill in the art that other embodiments incorporating its concepts may be used. It is felt, therefore, that this invention should not be restricted to the preferred embodiments but rather should be limited only by the spirit and scope of the appended claims.

What is claimed is:

1. A semiconductor structure comprising:

a first electrode and a second electrode disposed on a surface of the structure; and a bridging conductor connected between the first electrode and the second electrode, the bridging conductor comprising means for preventing dendrites and voids resulting from dislocation glide comprising a plurality of layers of different metals wherein the plurality of layers of different metals comprises at least three layers of an electrically conductive metal and at least four layers of a refractory metal, each one of the three layers of electrically conductive metal disposed between a corresponding pair of layers of the at least four layers of a refractory metal.

2. The semiconductor structure as recited in claim 1 wherein the refractory metal is titanium and the electrically conductive metal is gold.

3. The semiconductor structure as recited in claim 2 further comprising a layer of silicon nitride disposed on the plurality of layers of different metals.

4. A semiconductor structure comprising:

a substrate having a surface;

a first, a second, a third and a fourth electrode disposed on the surface of the substrate; and means for electrically connecting the first electrode with the fourth electrode comprising means for preventing dendrites and voids resulting from dislocation glide comprising a plurality of layers of different metals comprising at least three layers of an electrically conductive metal and at least four layers of a refractory metal, each one of the three layers of electrically conductive metal disposed between a corresponding pair of layers of the at least four layers of a refractory metal.

5. The semiconductor structure as recited in claim 4 wherein the refractory metal is titanium and the electrically conductive metal is gold.

6. The semiconductor structure as recited in claim 5 further comprising a layer of silicon nitride disposed on the plurality of layers of different metals.

* * * * *